(12) United States Patent
Seymour

(10) Patent No.: US 6,486,816 B2
(45) Date of Patent: Nov. 26, 2002

(54) CDAC OPERATION AT LOW SUPPLY VOLTAGES

(75) Inventor: Robert E. Seymour, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/825,515

(22) Filed: Apr. 3, 2001

(65) Prior Publication Data

US 2002/0140594 A1 Oct. 3, 2002

(51) Int. Cl.[7] .................................................. H03M 1/66
(52) U.S. Cl. ........................ 341/150; 341/144; 341/153; 341/155; 341/172
(58) Field of Search ................................ 341/144, 150, 341/153, 155, 172

(56) References Cited

U.S. PATENT DOCUMENTS

| | | | | |
|---|---|---|---|---|
| 4,449,066 A | * | 5/1984 | Aoyama et al. | 307/482 |
| 4,574,203 A | * | 3/1986 | Baba | 307/269 |
| 4,804,870 A | * | 2/1989 | Mahmud | 307/482 |
| 5,084,634 A | * | 1/1992 | Gorecki | 307/352 |
| 5,589,793 A | * | 12/1996 | Kassapian | 327/536 |
| 5,952,851 A | * | 9/1999 | Yuen | 326/88 |
| 5,999,461 A | * | 12/1999 | Verhaeghe et al. | 365/189.11 |
| 6,020,841 A | * | 2/2000 | Susak | 341/163 |
| 6,118,400 A | * | 9/2000 | Susak | 341/172 |
| 6,275,425 B1 | * | 8/2001 | Eliason | 307/352 |

* cited by examiner

Primary Examiner—Michael Tokar
Assistant Examiner—Khai Nguyen
(74) Attorney, Agent, or Firm—W. Daniel Swayze, Jr.; W. James Brady; Frederick J. Telecky, Jr.

(57) ABSTRACT

A CDAC circuit is provided that can operate at low supply voltages, for example, at supply voltages of 2.5 volts or less. To accomplish low voltage operation, switches in the CDAC circuit, such as sampling bit switches, mid-point switches or auto-zero switches, are gate-boosted to permit the voltage at the transmission gates to exceed the threshold voltage and thus permit the transmission gates to effectively operate. As a result, the CDAC can continue to operate, even with the existence of lower power supply voltages. In accordance with an exemplary embodiment, a gate-boosting circuit comprises a pair of N-channel transistor devices and a charging capacitor configured to provide a gate-boosting voltage to the transmission gates. In addition, the gate boosting circuit can comprise conventional CMOS devices, rather than more expensive low threshold MOSFET devices.

14 Claims, 4 Drawing Sheets

CDAC OPERATION AT LOW SUPPLY VOLTAGES

FIELD OF THE INVENTION

The present invention relates to a capacitor digital-to-analog converter (CDAC) for use in integrated circuits. More particularly, the present invention relates to a CDAC configured to operate at low supply voltages, for example at supply voltages of 2.5 volts or less.

BACKGROUND OF THE INVENTION

The demand for more reliable analog-to-digital converters (ADCs), digital-to-analog converters (DACs), and related components for use in communication, data acquisition, and battery operated applications continues to increase. As a result, integrated circuit manufacturers are requiring for such converters and devices to continue to improve their operating performance to meet the design requirements of a myriad of emerging applications.

A block diagram of an exemplary ADC is illustrated in FIG. 1. The ADC includes an analog input, e.g., a differential input, for receiving an analog voltage signal. In addition, the ADC is configured for providing a digital output, for example, a 16 bit digital serial word. Such ADC devices are generally configured for operation at various supply voltages, for example, at a supply voltage of approximately 5 volts, with a external reference configured for half the supply voltage, or for 2.5 volts. The ADC also includes an output span or conversion ratio comprising plus or minus the external reference voltage. For example, for a differential input device, the positive +IN terminal and the negative −IN terminal of the ADC are configured such that the terminals cannot be more than 2.5 volts apart in magnitude, with the conversion ratio in either direction, i.e., if the negative −IN terminal is fixed at 2.5 volts, the positive +IN terminal can vary between zero and 5 volts, but cannot swing past the power supply.

In battery-operated systems, it is desirable for CDAC devices to be capable of operating with as low a supply voltage as possible so that as the supply voltage drops, the CDAC can continue to function as desired. For example, some CDAC applications utilize a stack of battery cells to maintain the supply voltage level. However, as the stored charge of the cells is depleted, the battery voltage will continue to drop until the CDAC or other component part is no longer operational. Typically, these CDAC parts are configured with a 5 volt supply and are designed to operate with as little as 2.7 volts being supplied by the battery. Configuring the CDAC components to operate effectively with as little as 10% less supply voltage, e.g., with a 2.4 volts battery supply, is extremely difficult to accomplish. Nevertheless, it is expected that future applications will demand for CDAC components to operate at significantly lower supply voltages, for example, with battery supplies under 2 volts.

One possible approach to get the CDAC components to operate at lower supply voltages could include the utilization of a lower threshold MOSFET process. However, these MOSFET-based processes having lower thresholds are expensive to develop and manufacture, i.e., these MOSFET solutions are generally cost prohibitive, as opposed to applications using more desirable, standard CMOS processes. Further, these MOSFET-based processes still do not yield components that can operate at the lower supply voltage levels expected to be demanded in the future.

In addition to operating at low supply voltages, the components need to be able to operate at normal operating speeds. While some prior art attempts have been developed that provide CDAC devices that can operate at voltage levels as low as 1.9 volts, these devices have also been designed to operate at very slow speeds, such that the devices are not usable for most applications. Instead, the CDAC components need to be configured to operate not only at lower supply voltages, but also at a higher performance levels, for example, at higher data rates and processing speeds.

There are a couple of reasons that CDAC devices have difficulty operating at low supply voltages. One reason is the common-mode input range of the comparator, which is limited by the P-channel input of the differential pair of the comparator. Any loss to the input stage of the comparator is constant regardless of the supply voltage, so the effect of the comparator is more profound with lower power supplies.

However, the most prevailing reason that currently available CDAC devices have problem operating a low supply voltages is the inherent problem with the sampling bit switches for the CDAC. For example, with reference to a bit switch configured for a 5 volt supply, as illustrated in FIG. 2, these sampling bit switches are typically developed through the building of a transmission gate comprising a P-channel device and an N-channel device. The transmission gate can be connected to a 5 volt supply, $V_{SUPPLY}$, e.g., the P-channel device can have its gate electrode connected to zero volts and the N-channel device can have its gate electrode connected to a 5 volt supply. In addition, the respective drains of the P-channel and N-channel devices are connected together to a reference voltage, $V_{REF}$, which is generally configured for half the 5 volt supply, or 2.5 volts. Finally, the respective sources of the P-channel and N-channel devices are connected to a sampling capacitor, $C_S$. Accordingly, when the logic of the CDAC is turned on, the bit switch receives a 5 volt supply, and the transmission gate is configured to charge up the capacitor to the reference voltage of 2.5 volts, i.e., when turned on, the gate-source voltage, $V_{GS}$, of the P-channel device is 2.5 volts and the gate-source voltage of the N-channel device is −2.5 volts.

The transmission gates of the bit switches include a threshold voltage that must be exceeded before the P-channel or N-channel devices will effectively turn on, and thus charge the sampling capacitor $C_S$. This threshold voltage over temperature typically varies between 1.1 and 1.2 volts. Accordingly, the 2.5 volts provided by the reference voltage $V_{REF}$ is usually adequate to turn on the devices. However, as the supply voltage decreases from a span of 0 to 5 volts to a span of 0 to 2 volts, the reference voltage $V_{REF}$ drops to approximately 1 volt, resulting in only 1 volt at the transmission gate. Such a low voltage is generally insufficient to overcome the threshold voltage and thus turn on the transmission gates, at least not in a manner to permit operation of the bit switch to suitably charge the capacitor, i.e., at lower supply voltages, the transmission gates develop high impedance bands or dead bands in their transfer functions which prevent effective operation. Further decreases of the supply voltage, for example, to 1.8 volts or less, render the transmission gates, and thus the CDAC, inoperable as the transmission gates are switched off.

Such a problem with the reference voltage or input voltage failing to exceed the threshold voltage at the transmission gates can occur at several instances in the CDAC. For example, in addition to occurring at the bit switches, the above problems also occur at the mid-point switches and any auto-zero switches in the comparator. In other words, on each occasion that a transmission gate is configured to operate at mid-range power supply, for example, at 2.5 volts or less, the transmission gate will be difficult to turn on, and thus the CDAC will be rendered inoperable. Moreover, these threshold problems are typically worse for full differential parts, such as CDAC devices having a $+/-V_{REF}$ reference voltage, than for single-ended components, such as CDAC devices having a 0 to $V_{REF}$ reference voltage. For example, these differential parts typically utilize a reference voltage comprising ½ the full-scale range while single-ended parts utilize a full-scale reference. This characteristic for differential parts manifests itself as differential linearity errors above mid-range operation after the most significant bit (MSB) is turned "on." Still further, in applications where the reference voltage is replaced with a varying input signal, when the input signal level approaches mid-range, e.g., 1.2 volts or less, there is not enough voltage to overcome the threshold levels and thus turn "on" the transmission gates.

One solution considered for overcoming the threshold voltage of the transmission gate is the use of a charge pumping configuration to charge pump the power supply to a higher voltage. However, such a charge pumping configuration requires high power consumption, including the requirement of a significantly large charge pump comprising a very large capacitor device, thus rendering the solution impracticable for most applications.

Accordingly, a need exists for a CDAC that can be configured to operate at lower supply voltages, for example, less than 2.5 volts. In addition, a need exists for a CDAC that can operate at lower supply voltages while maintaining high performance levels, such as high speed and data rates.

SUMMARY OF THE INVENTION

The method and circuit according to the present invention addresses many of the shortcomings of the prior art. In accordance with various aspects of the present invention, a CDAC is provided that can operate at low supply voltages, for example, at supply voltages of 2.5 volts or less. In accordance with one aspect of the present invention, switches in the CDAC, such as sampling bit switches, are gate-boosted to permit the voltage at the transmission gates to exceed the threshold voltage and thus permit the transmission gates to effectively operate. As a result, the CDAC can continue to operate, even with the existence of lower power supply voltages. In accordance with an exemplary embodiment, a gate-boosting circuit comprises a pair of N-channel transistor devices and a charging capacitor configured to provide a gate-boosting voltage to the transmission gates.

In accordance with another aspect of the present invention, the gate boosting circuit can comprise conventional CMOS devices, rather than more expensive low threshold MOSFET devices. Moreover, the gate-boosting circuit can be configured with various switches in the CDAC circuit, such as bit sampling switches, mid-point switches, and auto-zero switches.

BRIEF DESCRIPTION OF THE DRAWINGS

A more complete understanding of the present invention may be derived by referring to the detailed description and claims when considered in connection with the Figure, where like reference numbers refer to similar elements throughout the Figure, and:

DETAILED DESCRIPTION OF EXEMPLARY EMBODIMENTS OF THE INVENTION

Figure 1:
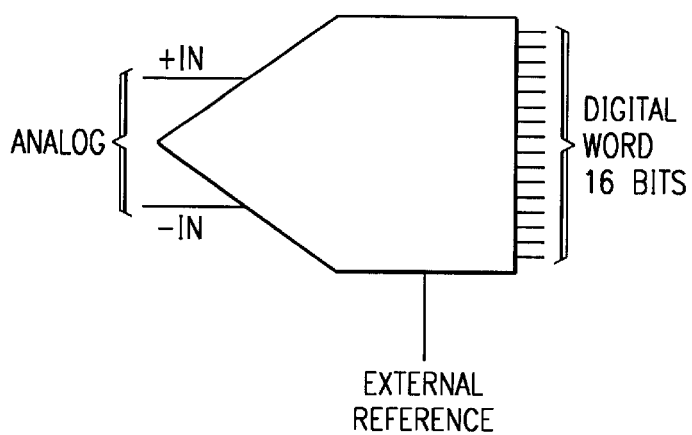
FIG. 1 illustrates a block diagram of a prior art analog-to-digital converter circuit.

The present invention may be described herein in terms of various functional components and various processing steps. It should be appreciated that such functional components may be realized by any number of hardware or structural components configured to perform the specified functions. For example, the present invention may employ various integrated components, e.g., buffers, supply rail references, current mirrors, and the like, comprised of various electrical devices, e.g., resistors, transistors, capacitors, diodes and the like whose values may be suitably configured for various intended purposes. In addition, the present invention may be practiced in any integrated circuit application where low voltage references impact the operation of the integrated circuit. Such general applications that may be appreciated by those skilled in the art in light of the present disclosure are not described in detail herein. However for purposes of illustration only, exemplary embodiments of the present invention will be described herein in connection with a CDAC device. Further, it should be noted that while various components may be suitably coupled or connected to other components within exemplary circuits, such connections and couplings can be realized by direct connection between components, or by connection through other components and devices located therebetween.

As discussed above, previous attempts for providing CDAC devices that can operate at low supply voltages have proven to be expensive, and in general, insufficient to meet the demands for such devices in the future, for example, by not performing at normal operating speeds. However, in accordance with various aspects of the present invention, a CDAC configured for low voltage operation has been developed which is inexpensive and can operate at higher performance levels.

In accordance with one aspect of the present invention, a CDAC circuit is configured with gate-boosted bit switches which facilitate the operation of the CDAC at lower supply voltages, for example, less than 2.5 volts. In particular, the gate-boosted switches can suitably drive the gate voltage of the transmission gates beyond the power supply voltage, and thus higher than the threshold voltage to effectively turn "on" the transmission gates. For example, by applying a boosted voltage signal to the transmission gates, such as the N-channel device, the bit switch can be configured to turn "on" over a greater span of the signal voltage actually being supplied to the transmission gate.

In accordance with an exemplary embodiment, a exemplary gate-boosting circuit comprises a pair of N-channel transistor devices configured with a charging capacitor that can be suitably pre-charged to provide a boosted voltage signal to the transmission gates. The charging capacitor is suitably configured during operation with a top plate of the capacitor connected to a high impedance node and a bottom plate of the capacitor connected to ground. This configuration of the charging capacitor permits the voltage on the top plate of the charging capacitor to increase past the power supply, as opposed to being limited by the power supply. Accordingly, by pre-charging a capacitor, and then discharging or otherwise applying the charged voltage to the transmission gate, the gate-boosting circuit can effectively drive the transmission gate past the power supply voltage, and thus past the threshold voltage to turn "on" the transmission gate.

Figure 3:
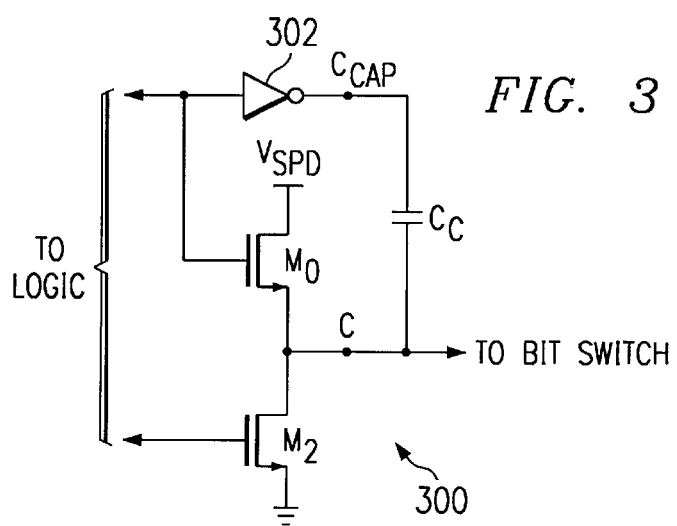
FIG. 3 illustrates a schematic diagram of an exemplary gate-boosting circuit in accordance with the present invention.

With reference to FIG. 3, an exemplary gate-boosting circuit 300 is illustrated. In accordance with this exemplary embodiment, gate-boosting circuit 300 comprises a pair of N-channel transistor devices, $M_0$ and $M_2$, and a charging capacitor $C_C$ suitably configured to provide a gate-boosting voltage. N-channel transistor devices $M_0$ and $M_2$ suitably comprise any type of N-channel transistor. However, to provide a low cost component part, N-channel transistor devices $M_0$ and $M_2$ comprise conventional CMOS transistors. The respective gate electrodes of N-channel transistor devices $M_0$ and $M_2$ are connected to a logic circuit configured for determining when charging capacitor $C_c$ needs to be pre-charged. In addition, N-channel transistor devices $M_0$ and $M_2$ are connected in series between a voltage source $V_{SPD}$ and ground, e.g., the drain of transistor $M_0$ is suitably connected to voltage source $V_{SPD}$, the source of transistor $M_0$ is coupled to the drain of transistor $M_2$, and the source of transistor $M_2$ is connected to ground. Voltage source $V_{SPD}$ suitably comprises the positive supply voltage available to drive the gate electrodes of transistor devices $M_0$ and $M_2$, and preferably the most positive supply available to gate-boosting circuit 300. In accordance with the exemplary embodiment, N-channel transistor device $M_0$ comprises a pre-charging device, and N-channel transistor device $M_2$ comprises a discharging device, i.e., transistor $M_0$ is configured to facilitate the pre-charging function on charging capacitor $C_C$, and transistor $M_2$ is configured to facilitate the discharging function of charging capacitor $C_C$.

In addition, gate-boosting circuit 300 suitably includes a pair of nodes, $C_{cap}$ and C, which are configured for connection of N-channel transistor devices $M_0$ and $M_2$ to charging capacitor $C_C$. Node $C_{cap}$ is suitably coupled to the gate electrode of transistor $M_0$, e.g., connected to the gate electrode of transistor $M_0$ through a logic device 302, such as an inverter, as illustrated in the exemplary embodiment, or even directly connected to the gate electrode of transistor $M_0$ with the modification of an input logic circuit. Further, node $C_{cap}$ is configured for providing a low impedance node and for receiving a power supply voltage for the charging of capacitor $C_C$. Meanwhile node C is suitably coupled to the source of transistor $M_0$ and the drain of transistor $M_2$ and is configured for connection to a bit switch or like components of a CDAC or other device.

Charging capacitor $C_C$ suitably comprises any capacitor capable of being pre-charged by a voltage, for example pre-charging of up to a couple of volts or more applied between nodes $C_{cap}$ and C. In accordance with this exemplary embodiment, charging capacitor $C_C$ has a top plate connected to low impedance node $C_{cap}$ and a bottom plate connected to node C. In addition, the bottom plate of charging capacitor $C_C$, which is connected to node C, is capable of being increased past the power supply voltage.

Figure 5:
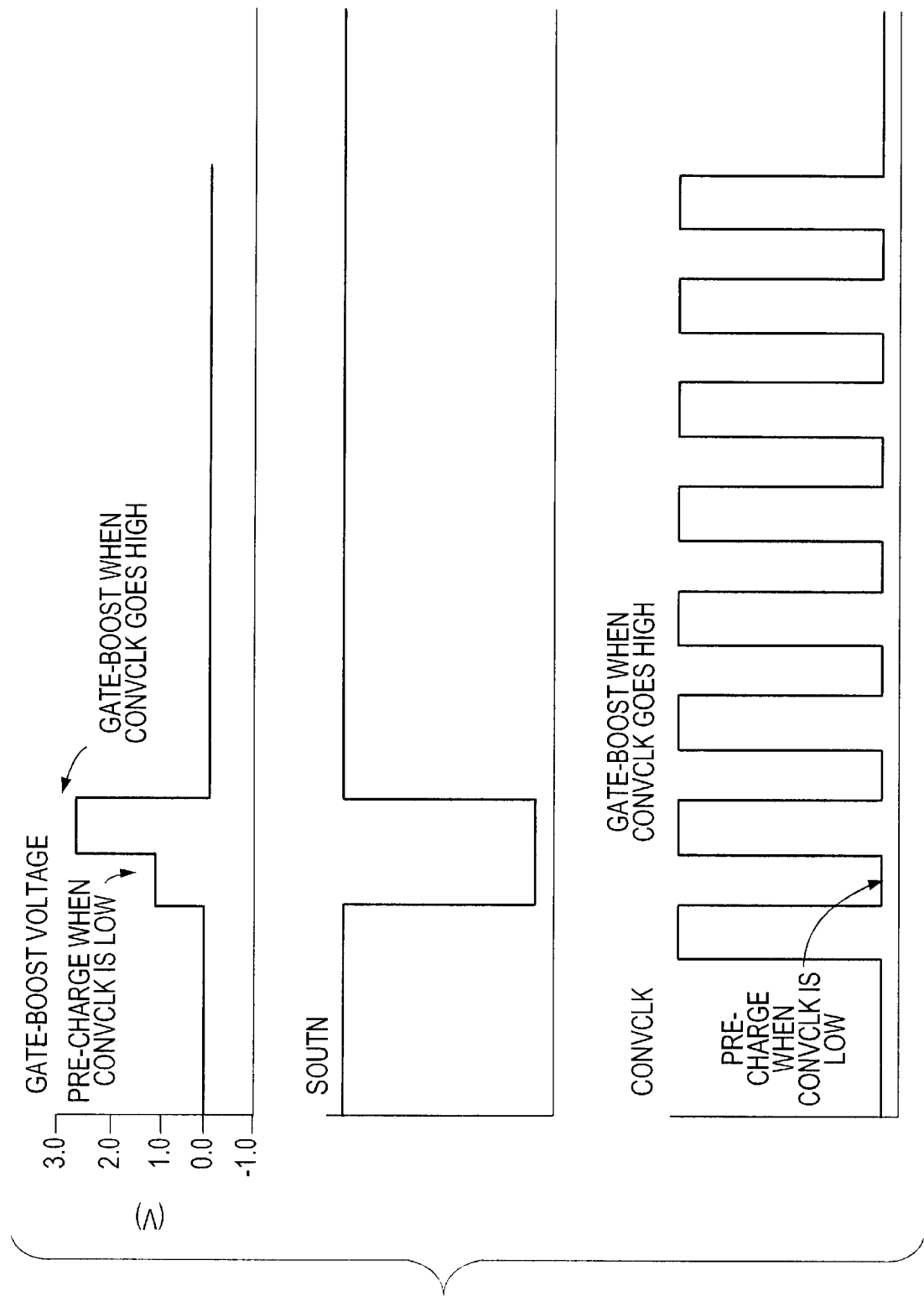
FIG. 5 illustrates an exemplary timing diagram of a gate-boosting voltage as may be provided by an exemplary gate-boosting circuit in accordance with the present invention.

An example of a timing diagram for the operation of boosting circuit 300 is illustrated in FIG. 5. During a pre-charge state, which can occur during the first half of a clock cycle, node $C_{cap}$ is suitably driven to a ground condition. For example, when the input to the gate electrode of N-channel transistor device $M_0$ comprises a high condition, such as 1.8 volts, inverter 302 is configured to provide a low signal to node $C_{cap}$, e.g., zero volts, thus pulling the top plate of capacitor $C_C$ low. In addition, since the input to the gate electrode of N-channel transistor device $M_0$ is tied to a power supply voltage, e.g., 1.8 volts, the voltage at node C will be equal to the 1.8 volts less the gate-source voltage $V_{GS}$ drop of N-channel transistor device $M_0$, i.e., approximately 1 volt or less. This results in a pre-charge of approximately 0.8 to 1.0 volts being pre-charged on charging capacitor $C_C$.

During the next half of a clock cycle, as the input to the gate electrode of N-channel transistor device $M_0$ comprises a low condition, inverter 302 is configured to provide a high condition, e.g., 1.8 volts, to node $C_{cap}$. As a result, node $C_{cap}$ of charging capacitor $C_C$ is raised to 1.8 volts, which along with the 0.8 to 1.0 volt precharge, raises node C of capacitor $C_C$ to approximately 2.6 to 2.8 volts. As a result of node C of charged capacitor $C_C$ having approximately 2.6 to 2.8 volts available for discharging to a bit switch and the like, a sufficient gate-boosted voltage can be applied to the transmission gates, permitting the devices to turn "on" for effective operation.

Figure 4:
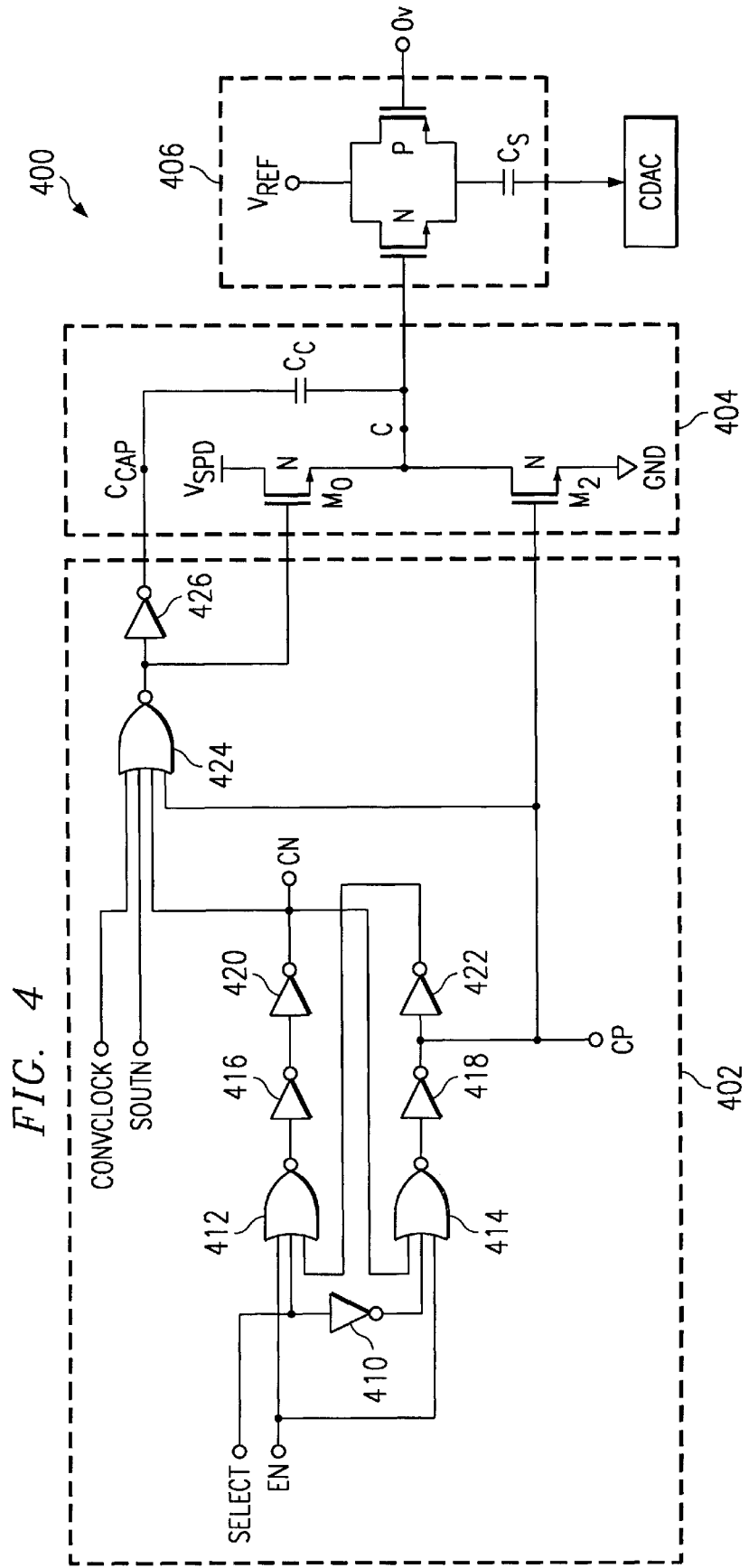
FIG. 4 illustrates a schematic diagram of an exemplary CDAC circuit including an exemplary gate-boosting circuit in accordance with the present invention.

With reference to FIG. 4, an application of a gate-boosted circuit 300 as may be applied to a CDAC circuit is illustrated. In accordance with this exemplary embodiment, a CDAC circuit 400 comprises a logic circuit 402, a gate-boosting circuit 404, and a bit sampling switch 406. Logic circuit 402 is configured for providing input signals to control gate-boosting circuit 404. For example, logic circuit 402 can provide input signals to the gate electrodes of N-channel transistor devices $M_0$ and $M_2$. In addition, logic circuit 402 is configured to ensure that N-channel transistor devices $M_0$ and $M_2$ are not turned "on" at the same time.

Figure 6:
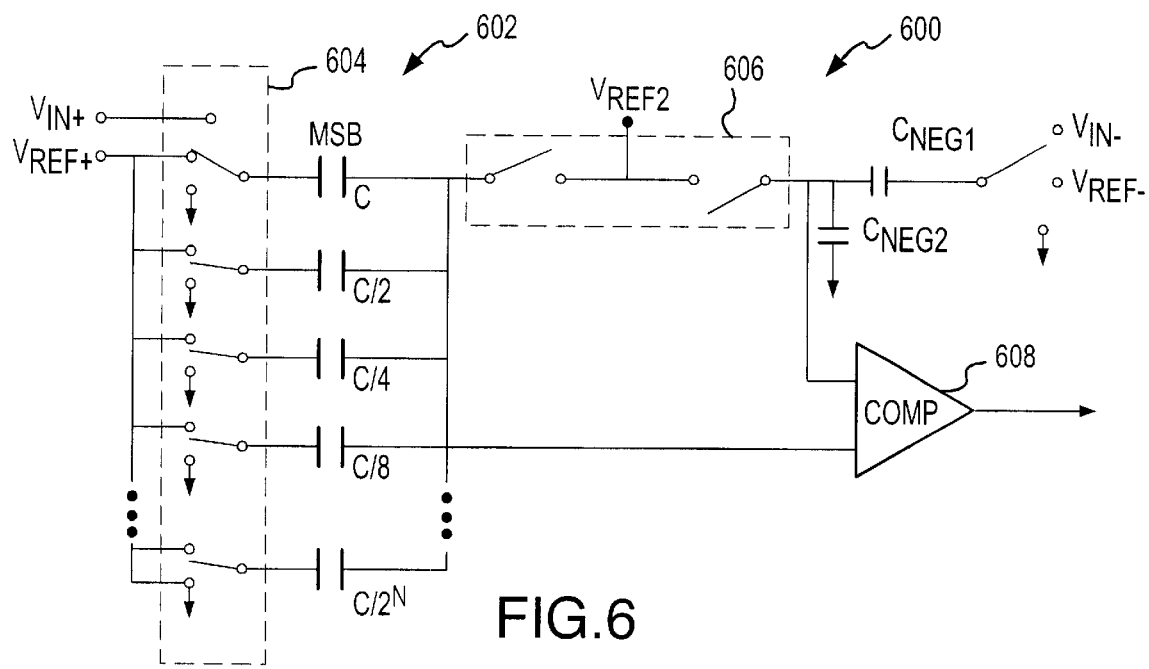
FIG. 6 illustrates a schematic diagram of an exemplary CDAC that may be configured to utilize gate-boosted switches in accordance with the present invention.

Further, logic circuit 402 is also suitably configured to control the operation of any switches in the CDAC circuit, such as bit switches, mid-point switches, or auto-zero switches. For example, as described below in connection with a capacitor array 602 illustrated in FIG. 6, the sampling bit switches are suitably configured to connect to various input terminals, such as an input voltage reference $V_{IN}$, a reference voltage terminal $V_{REF}$, and a ground terminal, depending on whether the CDAC circuit is in the process of sampling or converting. Accordingly, logic circuit 402 is configured to connect and disconnect the various switches of CDAC 400 in an appropriate sequence to facilitate the sampling and converting functions.

Figure 7:
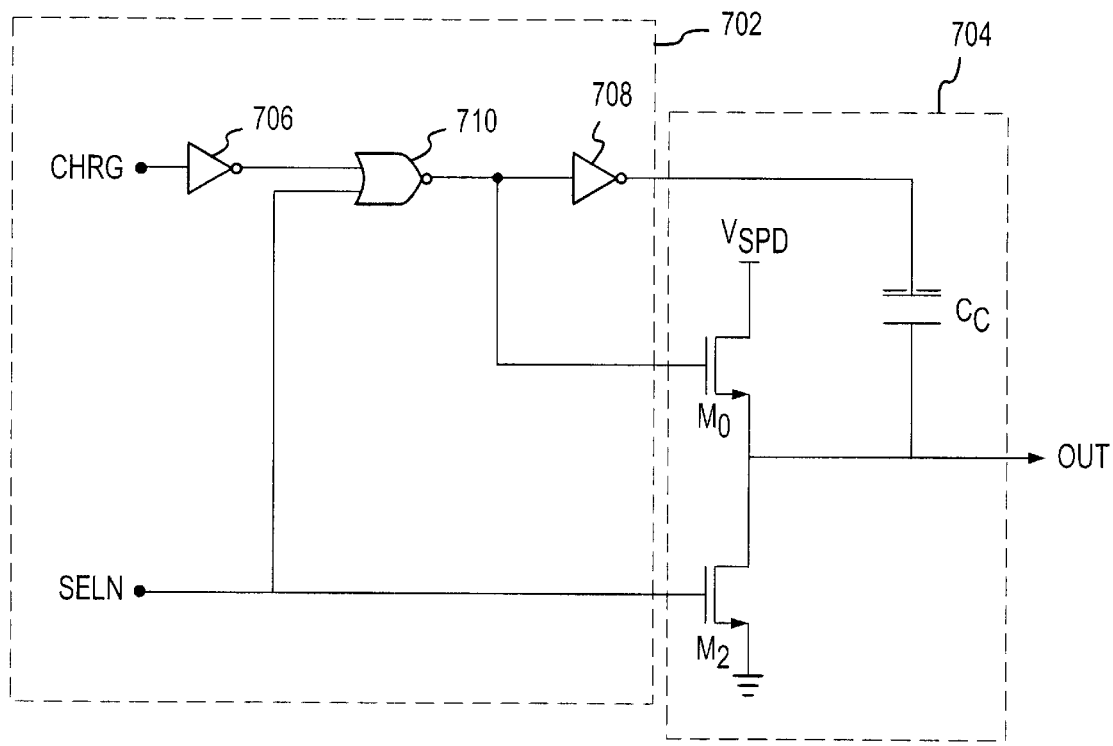
FIG. 7 illustrates a schematic diagram of an exemplary logic circuit in connection with an exemplary gate-boosting circuit in accordance with the present invention.

Logic circuit 402 can comprise various configurations for providing the logic signals to gate-boosting circuit 404. For example, with reference to FIG. 7, an exemplary logic circuit 702 can comprise a single stage configuration including a pair of inverter devices, 706 and 708, having a nor gate device 710 configured in between. In addition, logic circuit 702 can have one or more input signals, e.g., a charge signal (CHRG) for providing a signal for charging the capacitor and a select signal (SELN) for selecting the individual gate to be turned "on." During the charging period, when charge signal CHRG is in a "high" state, and select signal SELN is in a "low" state, the output of nor gate 710 is in a "high" state, and the output of inverter 708 is in a "low" state, thus pulling the top plate of charging capacitor $C_C$ to essentially ground, i.e., zero volts. As a result, charging capacitor $C_C$ of gate-boosting circuit 704 is suitably charged to a voltage of $V_{SPD}-V_{GS}$ of N-channel transistor device $M_0$, or to approximately 1.0 volt. At the end of the charging period, charge signal CHRG goes to a "low" state, thus operating to drive the output signal OUT to approximately $(2 \times V_{SPD})-V_{GS}$, or approximately 2.6 volts. In addition, logic circuit 702 ensures that N-channel transistor devices $M_0$ and $M_2$ are not turned "on" at the same time.

In accordance with another exemplary embodiment, with reference again to FIG. 4, logic circuit 402 can comprise a first nor gate 412, a second nor gate 414, and a third nor gate 424 configured with six inverter devices 410, 416, 418, 420, 422 and 426. Nor gates 412, 414 and 424, and inverter devices 410, 416, 418, 420, 422 and 426 can comprise any conventional devices for providing the logic functions described herein. In accordance with this exemplary embodiment, logic circuit 402 is configured to suitably boost the gate voltage of a selected bit switch, thus permitting that bit switch to operate with a low power supply voltage.

Nor gates 412 and 414 are suitably configured for receiving input signals, such as an enable input signal (EN) and a select input signal (SELECT), as well as a third input comprising a feedback signal, e.g., the respective outputs of inverters 420 and 422. Meanwhile, nor gate 424 is configured for receiving four input signals, including a conversion clock signal (CONVCLK, the clock signal that defines the conversation period), a bit test signal (SOUTN, which controls which gate boosting circuit is active among the possibly several in CDAC circuit 400), an on-state drive signal (CN) and an off-state drive signal (CP), where drive signals CN and CP define a break-before-make condition for transistors $M_0$ and $M_1$. Enable input signal EN is configured to allow logic circuit 402 to be enabled or disabled independently of the state of the other inputs. Select input signal SELECT is configured for controlling which logic circuit 402 among possibly several in CDAC circuit 400 is in an "on" state or condition. Conversion clock signal CONVCLK is also configured to control the gate-boosting function of circuit 404 along with the SOUTN signal such that the gate boosting for each bit is only active for ½ clock cycle during the complete conversion process. Bit state signal SELECT is configured to facilitate the boosting of the gate of each bit switch during a testing clock cycle, and then being configured to hold the "boosted" state without further refreshing if desired. Bit test signal SOUTN can be provided from the shift registers of a SAR converter, and suitably routed to logic circuit 402.

While logic circuit 402 is described in connection with a couple of exemplary embodiments, it should be noted that logic circuit 402 is not limited to either embodiment. Instead, logic circuit 402 can comprise any configuration of logic elements configured to provide control functions to gate-boosting circuit 404 to provide a gate-boosted voltage to bit switch 406. Further, logic circuit 402 can comprise any configuration of logic elements for controlling the operation of any switches in the CDAC circuit, such as bit switches, mid-point switches, or auto-zero switches, such as the connecting and disconnecting of the various switches of CDAC 400 in an appropriate sequence to facilitate the sampling and converting functions.

Gate-boosting circuit 404 suitably comprises a bootstrap circuit for pre-charging a capacitor and for providing a gate-boosted voltage to a transmission gate. In accordance with the exemplary embodiment, gate-boosting circuit 404 suitably comprises a pair of N-channel transistor devices configured with a charging capacitor that can be suitably pre-charged to provide a boosted voltage signal to the transmission gates. For example, gate-boosting circuit 404 can comprise various arrangements configured for performing the gate-boosting functions, such as the gate-boosting circuit 300 discussed above.

Figure 2:
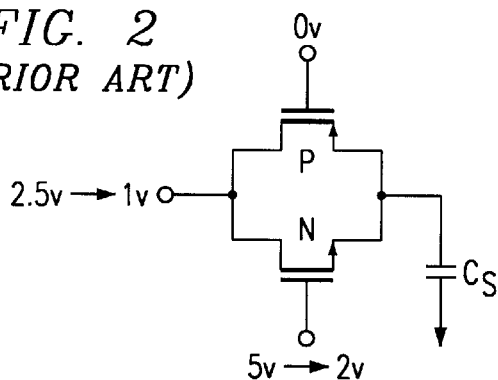
FIG. 2 illustrates a schematic diagram of a prior art bit switch circuit.

Bit switch 406 suitably comprises a sampling bit switch comprising a P-channel device and an N-channel device configured for the building of a transmission gate, for example, as illustrated in FIG. 2. In accordance with the exemplary embodiment, the gate electrode of the N-channel device is suitably connected to discharging node C of gate-boosting circuit 404. It should be noted that by boosting the N-channel gate at each bit switch, the amount of time for CDAC circuit 400 to settle is potentially shortened. Further, since the N-channel device includes an isolated N-well region, bit switch 406 can be driven past the power supply rail.

Comparator 608 suitably comprises a comparator circuit configured for receiving a pair of input signals, for example, positive and negative input and reference signals, and providing an output representative of the sampled bit switches to provide a serial output, i.e., a digital word. In accordance with an exemplary embodiment, comparator 608 can also configured to minimize the problems caused by low supply voltage operation of the CDAC circuit. For example, comparator 608 can be configured to operate at voltages below the threshold level of the bit switches by providing a cascading configuration, by applying gate boosting to the auto-zero switches, and by varying the auto-zero voltage with the comparator bias current to maintain sufficient headroom for the auto-zeroed comparator stages.

While CDAC circuit 400 has been described in conjunction with gate-boosting circuit 404 for providing a boosted gate-voltage to a bit switch circuit 406, it should be noted that other switching circuits could be provided with the boosted voltage. For example, the output at node C of gate-boosting circuit 404 could be suitably coupled to a midpoint switch of CDAC circuit 400. In addition, the output at node C of gate-boosting circuit 404 could also be suitably coupled to an auto-zero switch of comparator 408. Accordingly, any switch circuit in which a boosted gate-voltage can permit the switch circuit to be driven past the threshold voltage of the transmission gate, and thus operate with a low power supply, can be configured with gate-boosting circuit 404.

It should also be noted that an exemplary CDAC circuit 400 can be configured with a plurality of logic circuits 402 and gate-boosting circuits 404, with each of the circuits 402 and 404 corresponding to a single bit switch, for example, the MSB bit, or bit switch circuit 406, or with fewer circuits 402 and 404, in which a sharing of the functions of circuits 402 and 404 are shared with various of the bit switches within bit switch circuit 406.

During operation of CDAC circuit 400, bit test signal SOUTN goes low indicating that a bit switch is being tested. With the conversion clock signal CONVCLK in a "low" state, the N-channel gate of bit switch 406 can be suitably pre-charged by gate boosting circuit 404 for the first ½ clock cycle. Once conversion clock signal CONVCLK goes high during the remainder of the clock cycle, the gate voltage of the N-channel gate of bit switch 406 is suitably boosted above the supply voltage.

Having described an exemplary gate-boosting circuit 404 in connection with a CDAC circuit 400, an example of the implementation and operation of a CDAC circuit during the sampling of an input reference signal will now be provided. In accordance with an exemplary embodiment, with reference to FIG. 6, a CDAC circuit 600 is illustrated. CDAC circuit 600 suitably includes a positive reference voltage terminal $V_{REF}+$, a negative reference voltage terminal $V_{REF}-$, a second reference voltage terminal $V_{REF2}$, and a comparator 608.

In addition, on the positive side of CDAC circuit 600, a capacitor array 602 is provided which comprises a bit switch configuration 604 of N bits, with each bit switch configured for connection to reference voltage $V_{REF}+$ and ground, and being further configured with a series of capacitors. Each bit in bit switch configuration 604 suitably comprises a sampling bit switch comprising a P-channel device and an N-channel device configured for the building of a transmission gate, for example, bit switch 406.

Each of the capacitors has a common plate tied together and connected to a secondary on/off switch 606 for connection to second reference voltage $V_{REF2}$, with the other plate of each capacitor coupled to a respective bit switch. In addition, each capacitor is configured with a continuously decreasing capacitance value, e.g., from a value of C for the most significant bit (MSB), to a value of $C/2^N$ for the Nth bit.

In accordance with this exemplary embodiment, CDAC circuit 600 comprises a positive input voltage terminal $V_{IN}+$ that is suitably configured to facilitate sampling on the MSB bit. However, in accordance with other exemplary embodiments, CDAC circuit 600 can be configured for sampling on various of the other capacitors, or even all capacitors, rather than just sampling on the MSB bit.

CDAC circuit 600 also comprises a negative input voltage terminal $V_{IN}-$. In addition, on the negative side of CDAC circuit 600, a pair of capacitors, $C_{NEG1}$ and $C_{NEG2}$ are provided. Capacitor $C_{NEG1}$ is similar in configuration and function to the capacitor configured with the MSB bit on the positive side of circuit 600.

During initial sampling, the MSB bit switch is suitably connected to the positive input voltage terminal $V_{IN}+$, capacitor $C_{NEG1}$ is suitably connected to negative input voltage terminal $V_{IN}-$, and the secondary switches 606 are suitably closed. As a result, the most significant capacitors on the positive and negative side of circuit 600 are suitably charged to a signal level proportional to the respective input voltage signals $V_{IN}+$ and $V_{IN}-$, less the voltage at second reference voltage $V_{REF2}$. The remaining capacitors and bit switches are suitably connected to either ground or the positive reference voltage terminal $V_{REF}+$, depending on the architecture selected.

Comparator 608 suitably comprises a comparator circuit configured for receiving a pair of input signals, for example, positive and negative input and reference signals, and providing an output representative of the sampled bit switches to provide a serial output, i.e., a digital word. In particular, comparator 608 is configured for computing the difference between the charge of the positive side and the charge of the negative side of circuit 600. Once the charge values are stored, a bit by bit search is conducted by redistributing the stored charge to the various capacitors in CDAC circuit 600 to determine the value of the input signal $V_{IN}$. During this process, the respective CDAC capacitors are suitably connected to the positive and negative reference voltage terminals, $V_{REF}+$ and $V_{REF}-$ resulting in different voltages at the inputs of comparator 608 with respect to the different states of capacitor connections. For example, comparator 608 suitably determines whether the magnitude of the voltage on the positive side of circuit 600 is larger or smaller than the voltage of the negative side of circuit 600. If the positive side voltage is greater, the bit is determined to be a digital "1"; if the positive side voltage is smaller, the bit is determined to be a digital "0". In addition, if the bit is determined to be a "1", then the bit switch remains connected to the positive reference voltage terminal, and if the bit is determined to be a "0", then the bit switch is suitably connected to ground. It should be noted that this process can also be inverted such that a greater voltage becomes a "0" and the lesser voltage becomes a "1." At this time, the next bit is suitably compared by comparator 608 to determine whether the bit is a "1" or a "0", and the bit switch is similarly configured to be connected to the positive reference voltage terminal $V_{REF}+$ or ground, as described above, before proceeding to the next bit switch. Further, during this comparison process, the negative side switch remains connected to the negative reference voltage terminal $V_{REF}-$.

In accordance with an exemplary embodiment, comparator 608 can also configured to minimize the problems caused by low supply voltage operation of CDAC circuit 600. For example, comparator 608 can be configured to operate at voltages below the threshold level of the bit switches by providing a cascading configuration, by applying gate boosting to the auto-zero switches, and by varying the auto-zero voltage with the comparator bias current to maintain sufficient headroom for the auto-zeroed comparator stages.

With respect to the bit switches 604, as each bit switch is suitably connected to the positive reference voltage terminal $V_{REF}+$, the reference voltage is received at the N-channel of the bit switch. Without the use of a gate-boosting circuit, these bit switches would not properly operate when the reference voltage $V_{REF}+$ fails to exceed the threshold voltage of the transmission gate. However, through use of a gate-boosting circuit, such as gate-boosting circuit 404, the gate-voltage at the transmission gates can be suitably boosted beyond the power supply voltage. As a result, CDAC circuit 600 can effectively operate at lower power supply levels, for example, at 2.0 volts or less.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, by reversing the polarities of the charging capacitor and the N-channel transistor devices and the respective connections to a voltage source and ground. These alternatives can be suitably selected depending upon the particular application or in consideration of any number of factors associated with the operation of the system. In addition, the techniques described herein may be extended or modified for use with other integrated circuits separate from a CDAC circuit. These and other changes or modifications are intended to be included within the scope of the present invention, as expressed in the following claims.

What is claimed is:

1. A CDAC circuit configured for operation at low supply voltages, said CDAC circuit comprising:

a bit switch circuit comprising at least one bit switch, said bit switch circuit configured to facilitate sampling of an input voltage;

at least one sampling capacitor coupled to said at least one bit switch;

a comparator device for determining the value of a sampled charge on said sampling capacitor; and a gate-boosting circuit coupled to said bit switch circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal to a transmission gate of said bit switch circuit; and wherein said gate-boosting circuit is configured to permit said bit switch circuit to operate at a reference voltage of less than 2.5 volts, said pre-charging transistor and said discharging transistor being connected in a series arrangement, and wherein a drain of said pre-charging transistor is coupled to a voltage source, a source of said pre-charging transistor is coupled to a drain of said discharging transistor, a source of said discharging transistor is coupled to a ground terminal, and a bottom plate of said charging capacitor is coupled to said drain of said discharging transistor, wherein said CDAC circuit further comprises a logic circuit element, said logic circuit element being coupled between a gate electrode of said pre-charging transistor and a top plate of said charging capacitor.

2. A CDAC circuit configured for operation at low supply voltages, said CDAC circuit comprising:

a bit switch circuit comprising at least one bit switch, said bit switch circuit configured to facilitate sampling of an input voltage;

at least one sampling capacitor coupled to said at least one bit switch;

a comparator device for determining the value of a sampled charge on said sampling capacitor; and a gate-boosting circuit coupled to said bit switch circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal to a transmission gate of said bit switch circuit; and wherein said gate-boosting circuit is configured to permit said bit switch circuit to operate at a reference voltage of less than 2.5 volts, wherein said bit switch circuit includes a transmission gate comprising a P-channel device and an N-channel device, respective drains of said P-channel device and said N-channel device being connected together to a reference voltage, and respective sources of said P-channel device and said N-channel device being connected to said at least one sampling capacitor; and wherein an output of said gate-boosting circuit is coupled to a gate electrode of said N-channel device to provide a boosted voltage signal to said transmission gate of said bit switch circuit.

3. A CDAC circuit configured for operation at low supply voltages, said CDAC circuit comprising:

a bit switch circuit comprising at least one bit switch, said bit switch circuit configured to facilitate sampling of an input voltage;

at least one sampling capacitor coupled to said at least one bit switch;

a comparator device for determining the value of a sampled charge on said sampling capacitor; and a gate-boosting circuit coupled to said bit switch circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal to a transmission gate of said bit switch circuit; and wherein said gate-boosting circuit is configured to permit said bit switch circuit to operate at a reference voltage of less than 2.5 volts, said pre-charging transistor and said discharging transistor being connected in a series arrangement, and wherein a drain of said pre-charging transistor is coupled to a voltage source, a source of said pre-charging transistor is coupled to a drain of said discharging transistor, a source of said discharging transistor is coupled to a ground terminal, and a bottom plate of said charging capacitor is coupled to said drain of said discharging transistor, wherein said CDAC circuit further comprises a logic circuit configured for providing control functions to said gate-boosting circuit, and for facilitating control of operation for said bit switch circuit.

4. A CDAC circuit according to claim 3, wherein said CDAC circuit comprises a separate logic circuit and a separate gate-boosting circuit for each bit switch within said bit switch circuit.

5. A CDAC circuit according to claim 3, wherein said logic circuit further comprises a pair of inverter devices and a nor gate configured in between said pair of inverter devices, wherein one of said pair of inverter devices comprises an input coupled to a gate electrode of said pre-charging transistor and an output coupled to a top plate of said charging capacitor.

6. A CDAC circuit configured for operation at low supply voltages, said CDAC circuit comprising:

a bit switch circuit comprising at least one bit switch, said bit switch circuit configured to facilitate sampling of an input voltage;

at least one sampling capacitor coupled to said at least one bit switch;

a comparator device for determining the value of a sampled charge on said sampling capacitor; and a gate-boosting circuit coupled to said bit switch circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal to a transmission gate of said bit switch circuit; and wherein said gate-boosting circuit is configured to permit said bit switch circuit to operate at a reference voltage of less than 2.5 volts, wherein said CDAC circuit comprises a gate-boosting circuit having an output coupled to an auto-zero switch of said comparator device.

7. A gate-boosting circuit for facilitating the low voltage operation of a CDAC circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal; and wherein said gate-boosting circuit is configured for provide the gate boosted voltage signal to the CDAC circuit to permit said CDAC circuit to operate at a reference voltage of less than 2.5 volts, said pre-charging transistor and said discharging transistor being connected in a series arrangement, and wherein a drain of said pre-charging transistor is coupled to a voltage source, a source of said pre-charging transistor is coupled to a drain of said discharging transistor, a source of said discharging transistor is coupled to a ground terminal, and a bottom plate of said charging capacitor is coupled to said drain of said discharging transistor, wherein said gate-boosting circuit further comprises an inverter device, said inverter device being coupled between a gate electrode of said pre-charging transistor and a top plate of said charging capacitor.

8. A gate-boosting circuit for facilitating the low voltage operation of a CDAC circuit, said gate-boosting circuit comprising:

a pair of N-channel transistor devices comprising a pre-charging transistor and a discharging transistor; and a charging capacitor coupled to said pair of N-channel transistor devices that can be suitably charged to provide a boosted voltage signal; and wherein said gate-boosting circuit is configured for provide the gate boosted voltage signal to the CDAC circuit to permit said CDAC circuit to operate at a reference voltage of less than 2.5 volts, wherein said gate-boosting circuit is configured to provide the gate boosted voltage signal to a bit switch circuit to permit said bit switch circuit to operate at a reference voltage of less than 2.5 volts.

9. A gate-boosting circuit for facilitating the low voltage operation of a CDAC circuit, said gate-boosting circuit comprising:

a pair of N-channel transistor devices comprising a pre-charging transistor and a discharging transistor; and a charging capacitor having a bottom plate being coupled to a source of said pre-charging transistor and a drain of said discharging transistor; said charging capacitor capable of being charged to provide a boosted voltage signal;

an inverter device being coupled between a gate electrode of said pre-charging transistor and a top plate of said charging capacitor, and wherein said gate-boosting circuit is configured to provide the boosted voltage signal to the CDAC circuit to permit said CDAC circuit to operate at a reference voltage of less than 2.5 volts.

10. The gate-boosting circuit according to claim 9, wherein a drain of said pre-charging transistor is coupled to a voltage source, a source of said discharging transistor is coupled to a ground terminal, and a top plate of said charging capacitor is coupled to a low impedance node.

11. The gate-boosting circuit according to claim 10, wherein said gate-boosting circuit further comprises an inverter device, said inverter device being coupled between a gate electrode of said pre-charging transistor and said top plate of said charging capacitor.

12. A method for providing low voltage operation of a CDAC circuit, said method comprising the steps of:

pre-charging a charging capacitor with a pre-charging transistor during a first half clock cycle;

raising a voltage potential of a lower plate of the pre-charged capacitor to a maximum available supply voltage to provide a full voltage charge for the charging capacitor; and applying the full voltage charge from said charging capacitor to provide a gate-boosted voltage charge to the CDAC circuit to facilitate low voltage operation.

13. The method according to claim 12, wherein said step of pre-charging comprises pulling a top plate of the charging capacitor to a low condition, and providing a pre-charge voltage to a bottom plate of the charging capacitor.

14. The method according to claim 12, wherein said step of applying the full voltage charge comprises applying the voltage charge to an N-channel gate of a bit switch within the CDAC circuit.

* * * * *